United States Patent
Ehmke et al.

(10) Patent No.: US 11,000,915 B2
(45) Date of Patent: May 11, 2021

(54) STABILIZED TRANSIENT LIQUID PHASE METAL BONDING MATERIAL FOR HERMETIC WAFER LEVEL PACKAGING OF MEMS DEVICES

(71) Applicant: TEXAS INSTRUMENTS INCORPORATED, Dallas, TX (US)

(72) Inventors: John Charles Ehmke, Garland, TX (US); Simon Joshua Jacobs, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/087,120

(22) Filed: Mar. 31, 2016

(65) Prior Publication Data

US 2017/0283255 A1   Oct. 5, 2017

(51) Int. Cl.
| | |
|---|---|
| *B23K 20/02* | (2006.01) |
| *B23K 20/16* | (2006.01) |
| *C25D 5/12* | (2006.01) |
| *B23K 20/233* | (2006.01) |
| *B23K 20/24* | (2006.01) |
| *C25D 5/50* | (2006.01) |
| *C25D 7/12* | (2006.01) |
| *C25D 5/10* | (2006.01) |
| *C25D 5/14* | (2006.01) |
| *B81C 1/00* | (2006.01) |

(Continued)

(52) U.S. Cl.
CPC ......... *B23K 20/16* (2013.01); *B23K 20/026* (2013.01); *B23K 20/233* (2013.01); *B23K 20/24* (2013.01); *B81C 1/00269* (2013.01); *C25D 5/10* (2013.01); *C25D 5/12* (2013.01); *C25D 5/14* (2013.01); *C25D 5/50* (2013.01); *C25D 5/505* (2013.01); *C25D 7/123* (2013.01); *B23K 35/3033* (2013.01); *B23K 2101/42* (2018.08); *B81C 2203/019* (2013.01); *B81C 2203/036* (2013.01)

(58) Field of Classification Search
None
See application file for complete search history.

(56) References Cited

U.S. PATENT DOCUMENTS

| | | | | |
|---|---|---|---|---|
| 3,396,454 A | * | 8/1968 | Schroeder | H01L 21/00 228/123.1 |
| 5,280,414 A | * | 1/1994 | Davis | B23K 35/001 156/252 |

(Continued)

FOREIGN PATENT DOCUMENTS

WO   2011/099934   8/2011

*Primary Examiner* — Devang R Patel
(74) *Attorney, Agent, or Firm* — Brian D. Graham; Charles A. Brill; Frank D. Cimino

(57) ABSTRACT

In described examples, a transient liquid phase (TLP) metal bonding material includes a first substrate and a base metal layer. The base metal layer is disposed over at least a portion of the first substrate. The base metal has a surface roughness (Ra) of between about 0.001 to 500 nm. Also, the TLP metal bonding material includes a first terminal metal layer that forms an external surface of the TLP metal bonding material. A metal fuse layer is positioned between the base metal layer and the first terminal metal layer. The TLP metal bonding material is stable at room temperature for at least a predetermined period of time.

16 Claims, 4 Drawing Sheets

(51) Int. Cl.
*B23K 35/30* (2006.01)
*B23K 101/42* (2006.01)

(56) References Cited

U.S. PATENT DOCUMENTS

| | | | | |
|---|---|---|---|---|
| 7,400,042 | B2* | 7/2008 | Eriksen | C23C 14/021 |
| | | | | 257/757 |
| 7,628,309 | B1* | 12/2009 | Eriksen | H01L 21/7624 |
| | | | | 228/193 |
| 8,348,139 | B2* | 1/2013 | Liu | B23K 35/0238 |
| | | | | 228/246 |
| 9,140,898 | B2 | 9/2015 | Ehmke | |
| 2007/0152026 | A1* | 7/2007 | Suh | B23K 35/262 |
| | | | | 228/193 |
| 2009/0091024 | A1* | 4/2009 | Zeng | B23K 1/0016 |
| | | | | 257/737 |
| 2009/0162622 | A1* | 6/2009 | Van Veen | B23K 35/0222 |
| | | | | 428/198 |
| 2010/0032831 | A1* | 2/2010 | Park | H01L 24/10 |
| | | | | 257/737 |
| 2011/0101527 | A1* | 5/2011 | Cheng | H01L 24/11 |
| | | | | 257/738 |
| 2011/0272184 | A1* | 11/2011 | Park | H01L 23/49548 |
| | | | | 174/255 |
| 2012/0288995 | A1* | 11/2012 | El-Ghoroury | H01L 27/14618 |
| | | | | 438/107 |
| 2013/0037603 | A1* | 2/2013 | Choi | H01L 23/49816 |
| | | | | 228/203 |
| 2014/0177132 | A1* | 6/2014 | McConnell | B23K 1/0016 |
| | | | | 361/305 |
| 2014/0268295 | A1* | 9/2014 | Ehmke | G02B 26/0833 |
| | | | | 359/290 |
| 2015/0340328 | A1* | 11/2015 | Gandhi | H01L 24/03 |
| | | | | 257/762 |

* cited by examiner

STABILIZED TRANSIENT LIQUID PHASE METAL BONDING MATERIAL FOR HERMETIC WAFER LEVEL PACKAGING OF MEMS DEVICES

BACKGROUND

Microelectromechanical system (MEMS) devices are small, lightweight devices on the micrometer to millimeter scale, which typically combine mechanically moving parts and movable electrical power supplies and controls. MEMS devices may have complex components, and accordingly may be sensitive to thermal, acoustic or optical energy. MEMS devices are typically encapsulated or packaged to shield against ambient and electrical disturbances, and against stress.

Some MEMS devices, such as digital micro-mirror devices (DMDs), require hermetic packages, because a DMD may include an array of light modulating pixel element micro-mirrors whose reflectors are each selectively positioned to reflect light to a specific site. To avoid an accidental engagement of a reflector and its control electrode, a landing electrode may be added for each reflector. A risk exists that a deflected reflector may adhere to its associated landing electrode, which may be caused by high surface energy substances adsorbed on the surface of the landing electrode and/or on the portion of the reflector that contacts the landing electrode. Substances that may impart such high surface energy to the reflector-landing electrode interface include water vapor, carbon monoxide, carbon dioxide, oxygen, nitrogen, and other gases and organic components that result from (or are left behind after) the DMD's fabrication.

However, MEMS hermetic packaging is expensive and has many technical challenges. For example, hermetic wafer bonding on MEMS DMD with PVB/Zeolite getter systems requires temperatures less than about 175° C. to avoid degradation of the getter system, yet processing temperatures are necessary up to –150° C. Transient liquid phase (TLP) metal bonding materials are useful to form such hermetic bonds and packaging. However, the materials plated into the stack are often prone to significant metal diffusion, which may occur over hours, thereby inducing restrictions on material storage due to the reduced stability of the stack, which further imposes restrictions on the fabrication process of those MEMS.

SUMMARY

In described examples, a transient liquid phase (TLP) metal bonding material includes a first substrate and a base metal layer. The base metal layer is disposed over at least a portion of the first substrate. The base metal has a surface roughness (Ra) of between about 0.001 to 500 nm. Also, the TLP metal bonding material includes a first terminal metal layer that forms an external surface of the TLP metal bonding material. A metal fuse layer is positioned between the base metal layer and the first terminal metal layer. The metal fuse layer has a thickness of between about 200 to 400 Å. The TLP metal bonding material is stable at room temperature for at least a predetermined period of time.

DETAILED DESCRIPTION

Figure 1:
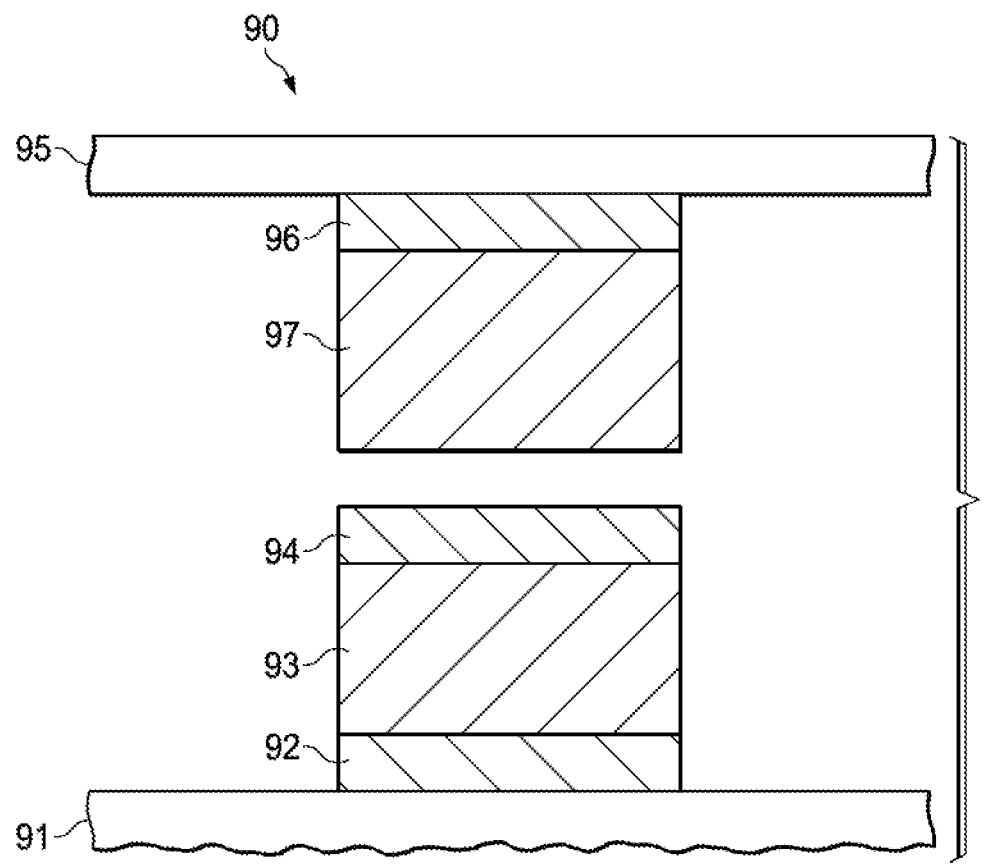
FIG. 1 shows a block diagram of a transient liquid phase (TLP) bonding system.

Transient liquid phase (TLP) bonding systems are well-suited to forming hermetic bonds and packaging, because they allow relatively low temperature bonding while creating high melting point intermetallics that do not re-melt at the bonding temperature. These bond metal systems use a low melting point metal or eutectic adjacent to a high melting point metal or eutectic. The low melting point metal is selected to have a melting point that is below the bonding temperature. After melting, the low melting point metal reacts with the high melting point metal, forming an intermetallic compound(s). The bond metals and intermetallic compounds formed must be mechanically robust and corrosion resistant to the exterior and interior MEMS environment. TLP systems (such as Au/In, Au/Sn:In, Au/Sn, Cu/In, or other systems where indium, Sn, or Sn:In create a low temperature component) may be suitable for hermetic DMD or other hermetic MEMS products. FIG. 1 shows a conventional TLP bonding system (including functionalized substrates) 90, which includes: a first substrate 91 (such as a first functionalized silicon wafer), a 0.5 um Ni barrier layer 92, a 3.5 um Au base metal layer 93, a 2.0 um indium terminal layer 94, a second substrate 95 (such as a second functionalized silicon wafer), a 0.5 um Ni barrier layer 96, and a 3.5 um Au base layer 97.

Two stacks (formed by 91, 92, 93, 94, 95, 96, 97) are placed in contact and heated to temperatures greater than 156° C. Indium 94 melts and fills the space between the Au surfaces (93 and 97), and then quickly reacts with the Au to form high melting point intermetallic compounds. In most cases, elemental indium is completely consumed into the Au. However, when the indium terminal layer 94 is plated into the stack, it is prone to significant metal diffusion, even at room temperature, and before placing the stacks in contact and heating. Accordingly, it imposes restrictions on the fabrication process of TLP metal bonding materials to hermetically packaged MEMS.

Figure 2:
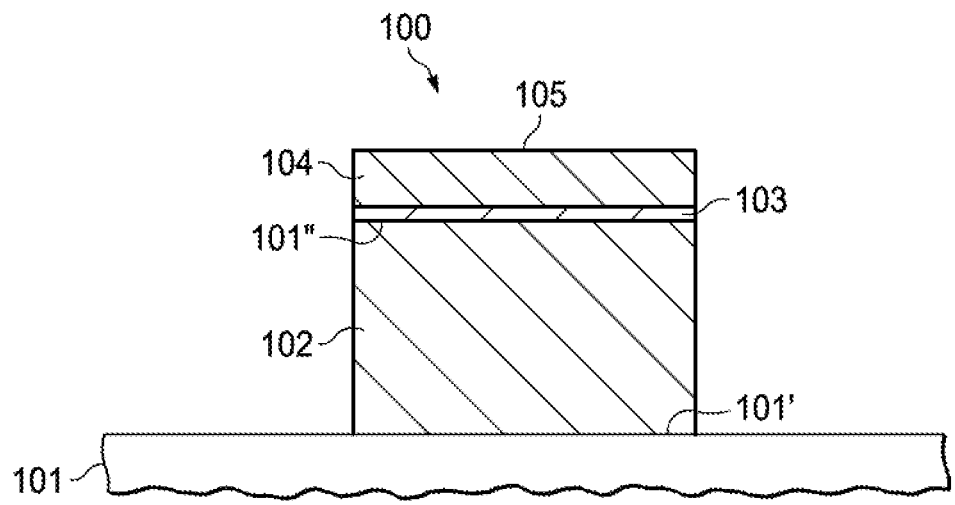
FIG. 2 shows a block diagram of a transient liquid phase (TLP) bonding system of example embodiments.

In accordance with example embodiments, FIG. 2 shows a TLP metal bonding material 100 for hermetically packaging MEMS. A very thin metal fuse layer 103 (which may include Ni in some embodiments) is plated between the base layer 102 and the indium layer 104. The base layer 102 is formed on a substrate 101. Accordingly, in some embodiments, a TLP metal bonding material 100 includes: a first substrate 101, which may be functionalized as described hereinabove; and a base metal layer 102 that is disposed over (e.g., positioned on) at least a portion of the first substrate 101. The base metal 101 has a surface 101" whose surface roughness (Ra) is between about 0.001 to 500 nm. The TLP metal bonding material stack concludes with a first terminal metal layer 104. The first terminal metal layer forms the external surface of the TLP metal bonding material 105. The metal fuse layer 103 is positioned between the base metal layer 101 and the first terminal metal layer 104. The metal fuse layer has a thickness of between about 200 to 400 Å, and the TLP metal bonding material is stable at room temperature.

In some embodiments of the TLP bonding material 100, the first terminal metal layer 104 has a lower melting point than both the metal fuse layer 103 and the base metal layer 101. The first substrate 101 may be a wafer, such as a silicon (or other type of semiconductor) wafer, a glass wafer, or a ceramic wafer. The first substrate may be a single wafer or a stack of wafers. The wafer may carry, contain or support a plurality of microelectric or MEMS die arranged in a regular pattern. In some examples, the die is a digital micro-mirror device (DMD). Also, the wafer may be functionalized with a microelectromechanical system, such as a DMD.

In some embodiments of the TLP bonding material 100, the base metal layer 102 has a thickness of between about 1,000 to 10,000 Å. In another embodiment, the base metal layer 102 has a thickness of between about 15,000 to 45,000 Å. In some examples, the first terminal metal layer has a thickness of between about 1,000 to 10,000 Å. In other examples, the first terminal metal layer has a thickness of between about 5,000 to 25,000 Å.

In some embodiments of the TLP bonding material: (a) the base metal layer 102 includes a metal selected from the group consisting of gold, silver, platinum, palladium, copper, zinc, tin, lead and cadmium; and (b) the first terminal metal layer 104 includes a metal selected from the group consisting of indium, tin, lead alloys, tin alloys, indium alloys, bismuth alloys and gallium alloys. The metal fuse layer 103 may be selected from the group consisting of chrome, nickel, cobalt, palladium, platinum, copper, rhodium, ruthenium and tin. In at least one example, the base metal layer 102 includes gold, the first terminal metal layer 104 includes indium, and the metal fuse layer includes nickel.

The melting point of the base metal that includes the base metal layer 102 may be about (e.g., approximately) 1100° C., while the melting point of the first terminal layer is about 150° C. Generally, the melting point of the first terminal layer 104 is lower than the melting point of the metal fuse layer 103 and the base metal layer 102. In at least one embodiment, the melting point of the second terminal layer is lower than the melting point of a base layer including a second substrate. The melting point of the metal fuse layer point may be about 1500° C.

Figure 3:
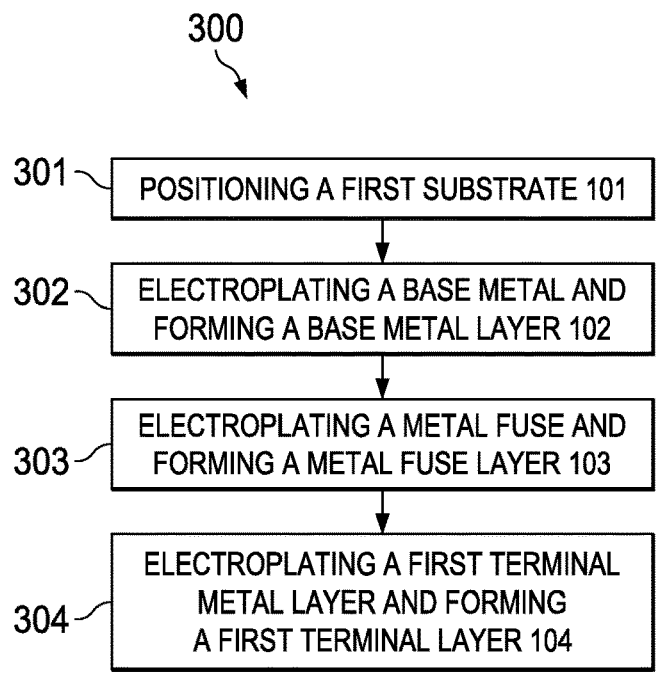
FIG. 3 shows a flow diagram of a method of making a TLP bonding material, in accordance with example embodiments.

FIG. 3 shows a process diagram 300 of example steps to form TLP metal bonding material of FIG. 2, in accordance with example embodiments. The method includes positioning a first substrate at step 301, electroplating a base metal onto a surface of the first substrate at step 302, and forming a base metal layer whose surface roughness (Ra) is between about 0.001 to 500 nm. The method further includes: (a) at step 303, electroplating a metal fuse on the base metal layer, and forming a metal fuse layer of between 200 and 400 Å; and (b) at step 304, electroplating a first terminal metal onto the metal fuse layer, and forming a terminal metal layer. As a result, the TLP metal bonding material is formed, and the material is stable at room temperature.

Figure 4:
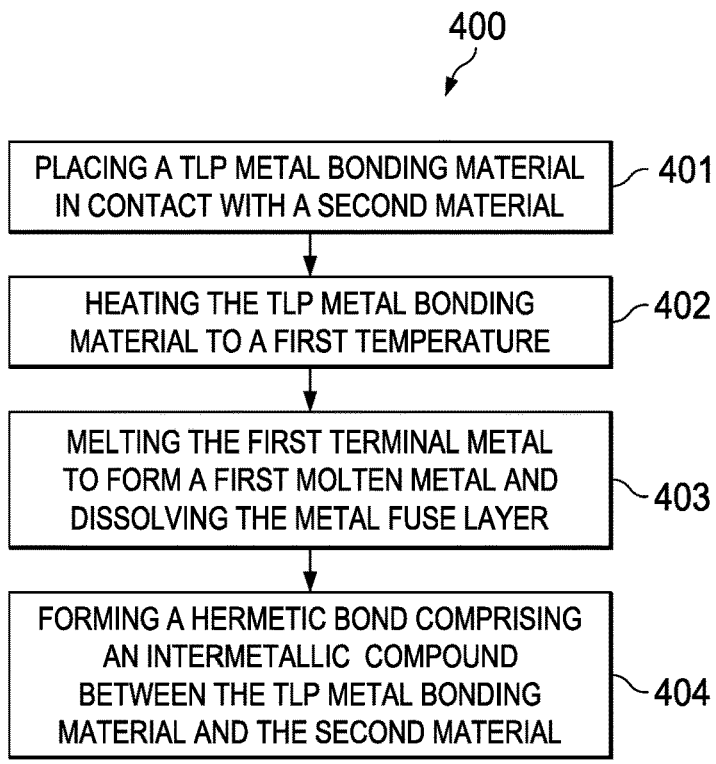
FIG. 4 shows a flow diagram of a method of making a hermetic wafer bonding system, in accordance with example embodiments.
Figure 5:
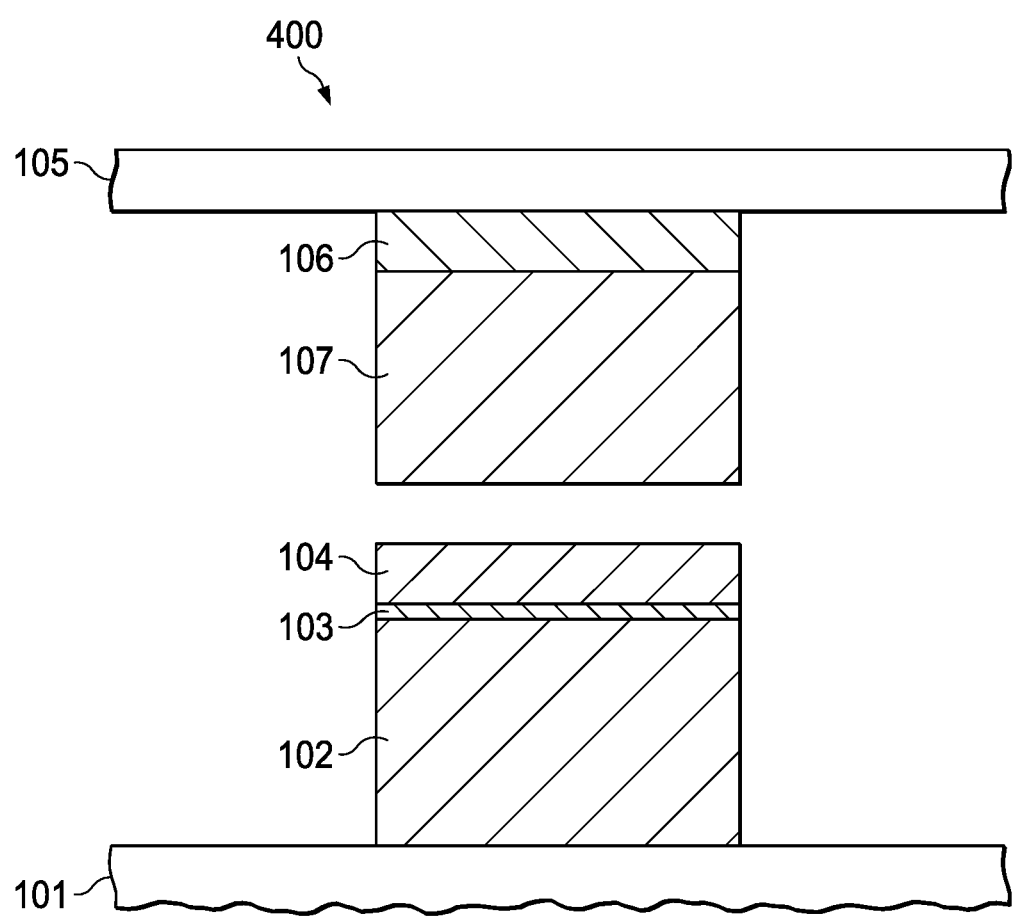
FIG. 5 shows a block diagram of TLP bonding material and a second substrate stack positioned for forming a hermetic bond of example embodiments.

This TLP metal bonding material is useful in hermetic packaging by forming a hermetic bond (FIG. 5). The method of FIG. 4 shows one example for forming the hermetic bond.

At step 401, the method includes placing (e.g., furnishing or fabricating) a TLP metal bonding material that includes a first silicon substrate, a base metal layer, a metal fuse layer, and a first terminal metal layer in contact with a second material. The second material may include a second substrate and a second terminal metal layer. At step 402, the method includes heating the TLP metal bonding material to a first temperature. At step 403, the method includes melting the first terminal metal to form a first molten metal. The first molten metal dissolves the metal fuse layer, and the first molten metal diffuses into the first terminal metal and the second terminal metal to form a thermally stable intermetallic compound. The hermetic bond includes the intermetallic compound, which is formed between the TLP metal bonding material and the second material at step 404.

The plating processes described herein help to keep processing costs low and avoid material waste through the application of materials, such as indium and Au. Further, for process integration reasons, all other materials used in such bond metal stacks are plated. For example, the Ni fuse layer can be readily plated, and the reaction rate of indium 104 with Ni at room temperature is slow, but molten indium reacts with Ni much more readily. Accordingly, the metal fuse layer includes a low rate of reaction with the first terminal metal layer at room temperature, but the rate of reaction increases between the molten indium and the fuse layer at higher temperatures. The Ni is attacked by the molten indium and forms a mixture of $In_7Ni_3$ and pure indium that, at very low Ni concentrations, has a liquid temperature below the bonding temperature. Accordingly, the Ni does not dissolve into the indium.

With a Ni layer of between about 200-400 Å thick, the indium is isolated from the base metal layer (e.g., Au), allowing room temperature shelf life after plating. Limited thermal processing below the indium melting point post plating is also possible. During the hermetic bonding process described herein, the thin Ni reacts with and is consumed by molten indium, allowing the indium to contact and quickly react with the base Au layer 102 under the Ni 103.

Figure 6:
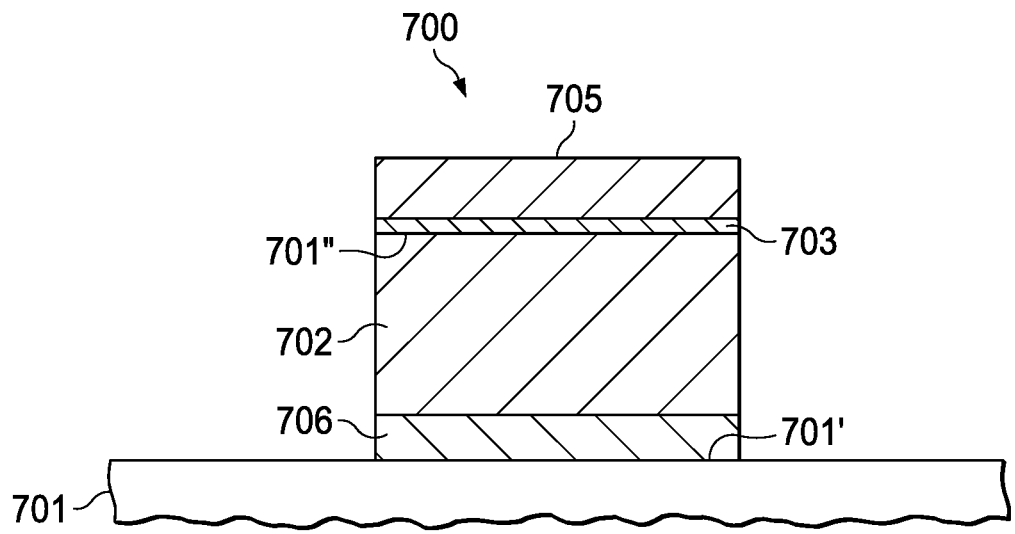
FIG. 6 shows a block diagram of TLP bonding material of example embodiments.

In some embodiments of forming the hermetic bond, the second substrate is a silicon wafer. In other embodiments of forming the hermetic bond, the intermetallic compound includes the base metal, fuse metal, first terminal metal, and second terminal metal. The hermetic bond may include the base metal and the first and second terminal metals. The intermetallic compound may have a melting point that is greater than a melting point of the first terminal metal, and may be lower than a melting point of the second terminal metal and a melting point of the base metal. In some examples, the intermetallic compound includes Indium and gold, and may include between 20-30% indium by atomic percent. The hermetic bond includes a hermetic package for a microelectromechanical system, such as DMDs. FIG. 6 illustrates an embodiment of a TLP metal bonding material 700. Bonding material 700 includes a first substrate 701 and a base metal layer 702 disposed over (e.g., positioned on) metal layers 706 that are positioned on the first substrate 701. In some embodiments, the positioning of the metal layers may be through a mask of photoresist or other insulator, or alternatively by patterning the preceding metal layers.

The base metal layer 702 has a surface 701" whose surface roughness (Ra) is between about 0.001 to 500 nm, and it concludes with a first terminal metal layer 705 that forms the external surface of the TLP metal bonding material 700. A metal fuse layer 703 is positioned between the base metal layer 702 and the first terminal metal layer 705.

The metal fuse layer 703 may have a thickness of between about 200 to 400 Å. The TLP metal bonding material is stable at room temperature.

Figure 7:
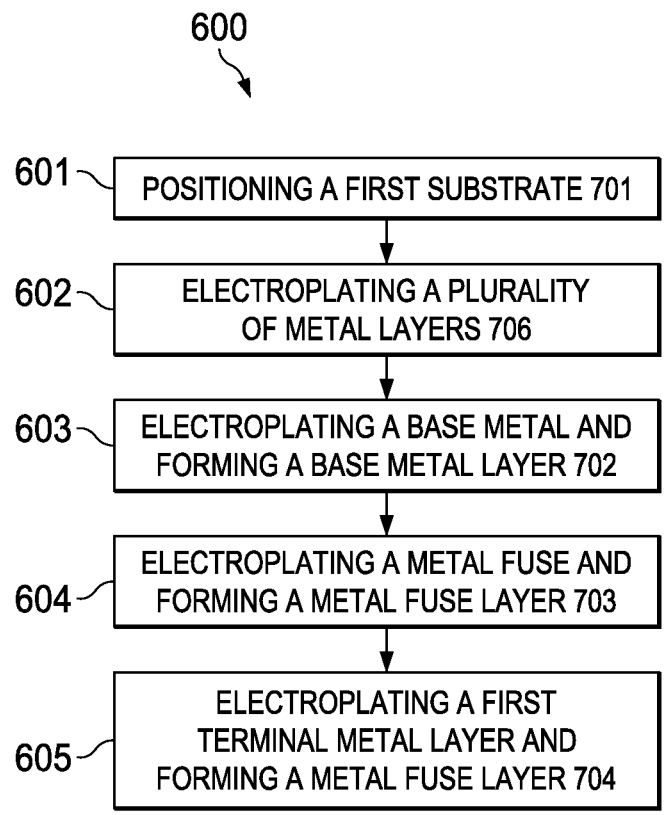
FIG. 7 shows a flow diagram of a method of making a TLP bonding material, in accordance with example embodiments.

FIG. 7 shows a process diagram 600 of example steps to form the TLP metal bonding material of FIG. 6. The method includes positioning a first substrate at step 601, plating the metal layers on at least a portion of the surface of the first substrate at step 602, and electroplating the base metal onto at least a portion of the surface of the metal layers to form a base metal layer at step 603. The base metal layer has a surface roughness (Ra) of between about 0.001 to 500 nm. At step 604, the method includes electroplating a metal fuse on the base metal layer, and forming a metal fuse layer of between 200 and 400 Å. At step 605, the method includes electroplating a first terminal metal onto the metal fuse layer, and forming a terminal metal layer, thereby forming the TLP metal bonding material that is stable at room temperature.

Accordingly, in some embodiments of the TLP bonding material, the first terminal metal layer has a lower melting point than both the metal fuse layer and the base metal layer. In another embodiment of the TLP bonding material, the first substrate is a silicon wafer. In a further embodiment, the wafer is functionalized with a microelectromechanical system, such as a DMD. In yet another embodiment of the TLP bonding material, the metal fuse layer includes a low rate of reaction with the first terminal metal layer.

In some embodiments of the TLP bonding material, the base metal layer has a thickness of between about 15,000 to 45,000 Å, and the first terminal metal layer has a thickness of between about 5,000 to 25,000 Å. In further embodiments of the TLP bonding material, the base metal layer includes a metal selected from the group consisting of gold, silver, platinum, palladium, copper, zinc, tin, lead, and cadmium. Also, in some embodiments of the TLP bonding material, the first terminal metal layer includes a metal selected from the group consisting of indium, tin, lead alloys, tin alloys, indium alloys, bismuth alloys, and gallium alloys, and in some embodiments the metal fuse layer is selected from the group consisting of chrome, nickel, cobalt, palladium, platinum, copper, rhodium, ruthenium, and tin. For example, the base layer may include gold, the first terminal layer may include indium, and the metal fuse layer may include nickel.

In at least one embodiment, the melting point of the base metal is about 1100° C., and the melting point of the first terminal layer is about 150° C. The melting point of the first terminal layer may be lower than the melting point of the metal fuse and the base layer. In at least one embodiment, the melting point of the second terminal layer is lower than the melting point of the base layer including the second substrate, and in at least one embodiment the melting point of the metal fuse layer point is about 1500° C.

In another embodiment, a method of making TLP metal bonding material includes electroplating a base metal onto at least a portion of a surface of the first substrate, or electroplating the base metal onto at least a portion of a surface of a plurality of metal layers (such plurality being positioned on at least a portion of the surface of the first substrate), and forming a base metal layer. The base metal layer may have a surface roughness (Ra) of between about 0.001 to 500 nm. The method further includes electroplating a metal fuse on the base metal layer and forming a metal fuse layer of between 200 and 400 Å. The method also includes electroplating a first terminal metal onto the metal fuse layer and forming a terminal metal layer. In some embodiments of such method, the first substrate is a wafer.

In some embodiments, the wafer may include a silicon (or other type of semiconductor) wafer, glass wafer, or a ceramic wafer. Further, a stack of such wafers may be included as the first substrate and bonded face-to-face. In embodiments that include a stack of wafers, the wafers may have cut-outs, vias and other features in which certain areas of certain wafers are removed, such that the final wafer stack is still amenable to wafer bonding. In other embodiments, the wafers may include a plurality of individually formed microelectronic or MEMS die. In at least one example, the die may include a DMD. The metal fuse layer may be formed at an example deposition rate of less than 100 Å per second. The base metal is electroplated, and the first terminal metal also may be electroplated. In a further embodiment, a method of making TLP metal bonding material includes electroplating the base metal onto at least a portion of a surface of a plurality of metal layers (such plurality being positioned on at least a portion of the surface of the first substrate), and forming a base metal layer. The base metal layer may have a surface roughness (Ra) of between about 0.001 to 500 nm. The method further includes electroplating a metal fuse on the base metal layer and forming a metal fuse layer of between 200 and 400 Å. The method also includes electroplating a first terminal metal onto the metal fuse layer and forming a terminal metal layer.

In another embodiment, a method includes placing a TLP metal bonding material including a first silicon substrate, a base metal layer, a metal fuse layer, and a first terminal metal layer in contact with a second material. The second material includes a second substrate and a second terminal metal layer. The method further includes heating the TLP metal bonding material to a first temperature and melting the first terminal metal to form a first molten metal that dissolves the metal fuse layer. The first molten metal diffuses into the first terminal metal and the second terminal metal to form a thermally stable intermetallic compound that includes the hermetic bond between the TLP metal bonding material and the second material. In some embodiments, a thermally stable intermetallic compound is stable at room temperature for at least a predetermined period of time. The predetermined period of time may include a number of days, months or years.

In other embodiments of forming the hermetic bond, the intermetallic compound includes the base metal, fuse metal, first terminal metal, and second terminal metal. In some embodiments, the hermetic bond includes the base metal and the first and second terminal metals. The intermetallic compound may have a melting point that is greater than a melting point of the first terminal metal, but lower than a melting point of the second terminal metal and a melting point of the base metal. The intermetallic compound may include indium and gold (e.g., 20-30% indium by atomic percent). In some embodiments, the hermetic bond includes a hermetic package for a microelectromechanical system, such as DMDs.

Modifications are possible in the described embodiments, and other embodiments are possible, within the scope of the claims.

What is claimed is:
1. A transient liquid phase (TLP) metal bonding material, comprising:
 a non-metallic substrate;
 a base metal layer disposed on the non-metallic substrate, wherein the base metal layer consists essentially of gold;
 a terminal metal layer that forms an external surface of the TLP metal bonding material, wherein the terminal metal layer consists essentially of indium; and a metal fuse layer disposed between the base metal layer and the terminal metal layer, wherein the metal fuse layer consists essentially of nickel, and wherein the metal fuse layer is disposed to diffuse into the terminal metal layer and has a thickness such that the metal fuse layer is dissolved at a melting temperature of the terminal metal layer and the indium of the terminal metal layer physically contacts the base metal layer.

2. The material of claim 1, wherein the melting temperature of the terminal metal layer is lower than both a melting temperature of the metal fuse layer and a melting temperature of the base metal layer.

3. The material of claim 1, wherein the non-metallic substrate is selected from the group consisting of a semiconductor wafer, a glass wafer, a ceramic wafer, and a stack of semiconductor, glass, or ceramic wafers.

4. The material of claim 1, wherein the metal fuse layer has a low rate of reaction with the terminal metal layer at room temperature.

5. The material of claim 1, wherein the base metal layer has a thickness of between about 15,000 to 45,000 Å.

6. The material of claim 1, wherein the terminal metal layer has a thickness of between about 5,000 to 25,000 Å.

7. The material of claim 1, wherein the terminal metal layer has a thickness of between about 1,000 to 10,000 Å.

8. The material of claim 1, wherein the metal fuse layer extends between and physically contacts the base metal layer and the terminal metal layer.

9. A transient liquid phase (TLP) metal bonding material, comprising:
  a non-metallic substrate;
  a base metal layer disposed on the non-metallic substrate, wherein the base metal layer consists essentially of copper;
  a terminal metal layer that forms an external surface of the TLP metal bonding material disposed on the base metal layer, wherein the terminal metal layer consists essentially of indium; and
  a metal fuse layer disposed between the base metal layer and the terminal metal layer, wherein:
    the metal fuse layer consists essentially of nickel;
    the metal fuse layer extends between and physically contacts the base metal layer and the terminal metal layer; and
    the metal fuse layer has a thickness such the metal fuse layer is configured to diffuse and dissolve at a melting point of the terminal metal layer such that the indium of the terminal metal layer physically contacts the base metal layer.

10. A bonding structure comprising:
  a substrate;
  a base layer disposed on the substrate, wherein the base layer consists essentially of a first metal;
  a fuse layer disposed on the base layer in physical contact with the base layer, wherein the fuse layer consists essentially of a second metal; and
  a terminal layer disposed on the fuse layer in physical contact with the fuse layer, wherein the terminal layer consists essentially of a third metal, and wherein the fuse layer has a thickness such the fuse layer is configured to diffuse and dissolve at a melting temperature of the terminal layer such that the third metal of the terminal layer physically contacts the base layer.

11. The bonding structure of claim 10, wherein the second metal is nickel and the third metal is indium.

12. The bonding structure of claim 11, wherein the first metal is from a group consisting of: gold and copper.

13. The bonding structure of claim 10, wherein the thickness of the fuse layer is between about 200 Å and about 400 Å.

14. The bonding structure of claim 10, wherein the second metal and the third metal are selected to form a thermally stable intermetallic compound upon diffusion of the fuse layer into the terminal layer.

15. The bonding structure of claim 10, wherein the first metal, the second metal, and the third metal are selected such that the melting temperature of the terminal layer is lower than a melting temperature of the fuse layer and a melting temperature of the base layer.

16. The material of claim 1, wherein the thickness of the metal fuse layer is between about 200 Å and about 400 Å.

* * * * *